(12) United States Patent
Nasser

(10) Patent No.: US 9,219,499 B2
(45) Date of Patent: Dec. 22, 2015

(54) RUN TIME COMPRESSION METHOD FOR A VEHICLE COMMUNICATION BUS

(71) Applicant: Robert Bosch GmbH, Stuttgart (DE)

(72) Inventor: Ahmad Nasser, Plymouth, MI (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/280,322

(22) Filed: May 16, 2014

(65) Prior Publication Data

US 2015/0333766 A1   Nov. 19, 2015

(51) Int. Cl.
| | |
|---|---|
| *H03M 7/00* | (2006.01) |
| *H03M 7/46* | (2006.01) |
| *G01C 21/20* | (2006.01) |
| *B60K 26/04* | (2006.01) |
| *B60G 17/015* | (2006.01) |
| *B60W 10/00* | (2006.01) |
| *G06F 13/42* | (2006.01) |

(52) U.S. Cl.
CPC .............. *H03M 7/46* (2013.01); *B60G 17/015* (2013.01); *B60K 26/04* (2013.01); *B60K 41/004* (2013.01); *G01C 21/20* (2013.01); *G06F 13/426* (2013.01); *B60K 2026/046* (2013.01)

(58) Field of Classification Search
CPC ................. B60K 41/004; B60K 26/04; B60K 2026/046; G06F 13/426; B60G 17/015; G01C 21/20; H03M 7/02
USPC ............................................. 341/59, 87, 106
See application file for complete search history.

(56) References Cited

U.S. PATENT DOCUMENTS

| | | | |
|---|---|---|---|
| 5,734,340 A * | 3/1998 | Kennedy ........................ | 341/59 |
| 5,892,535 A | 4/1999 | Allen et al. | |
| 6,195,026 B1 * | 2/2001 | Acharya ........................ | 341/60 |
| 6,799,101 B2 | 9/2004 | Hawig et al. | |
| 7,095,897 B2 * | 8/2006 | Golla et al. .................. | 382/239 |
| 7,299,236 B2 * | 11/2007 | Kang et al. | |
| 7,676,727 B2 | 3/2010 | Harter et al. | |
| 7,679,649 B2 | 3/2010 | Ralston et al. | |

(Continued)

FOREIGN PATENT DOCUMENTS

| | | |
|---|---|---|
| CN | 201754594 | 3/2011 |
| CN | 203246407 | 10/2013 |
| JP | 2007184874 | 7/2007 |

OTHER PUBLICATIONS

Burtscher et al., "High Throughput Compression of Double-Precision Floating-Point Data," Computer Systems Laboratory, Nov. 2006, 11 pages.

*Primary Examiner* — Brian Young
(74) *Attorney, Agent, or Firm* — Michael Best & Friedrich LLP

(57) ABSTRACT

A method for run time zero byte compression of data on a communication bus of a vehicle includes determining a number of zero byt.es provided in a data frame. When there are enough zero bytes, an encoding byte is generated that maps the locations of the zero bytes in the data frame. A data length code related to the number of non-zero data bytes and the encoding byte is provided in a device header. The data length code has a value less than an uncompressed data frame. The compressed data frame is transmitted with the encoding byte and the uncompressed non-zero data bytes. To decompress the compressed data frame, the encoding byte maps the locations of the zero bytes for a data frame. The non-zero data bytes are then provided at the proper locations to recreate the data frame.

18 Claims, 4 Drawing Sheets

(56) References Cited

U.S. PATENT DOCUMENTS

| | | | |
|---|---|---|---|
| 8,010,704 B2 * | 8/2011 | Stengelin | ............... 709/247 |
| 8,321,084 B2 | 11/2012 | Yamashita et al. | |
| 2003/0228005 A1 | 12/2003 | Melick et al. | |
| 2005/0166036 A1 | 7/2005 | Catherwood et al. | |
| 2011/0264844 A1 | 10/2011 | Fischer et al. | |
| 2013/0217409 A1 | 8/2013 | Bridges et al. | |

* cited by examiner

RUN TIME COMPRESSION METHOD FOR A VEHICLE COMMUNICATION BUS

BACKGROUND

The present invention relates to a method and apparatus for run time compression of data on a communication bus to minimize bandwidth so that additional electronic control units can be provided for vehicles.

Data is transmitted in data frames over a vehicle communication bus. Each frame typically has eight bytes of data. Each byte includes eight bits of information.

As busload data on a controlled area network (CAN) bus nears bandwidth limits, more buses must be added to obtain proper results. There is a message priority scheme. Thus, low priority messages get delayed for long periods of time, reducing performance.

A compression method is needed that reduces busload without requiring additional hardware and without requiring a significant increase in central processor unit (CPU) time for data compression and data decompression. The method must integrate with existing network software.

SUMMARY

In one embodiment, the invention provides a method for run time zero byte compression of data for transmission over a communication bus for a vehicle, the method being executed on an electronic control unit connected to the communication bus. The method comprises the steps of: obtaining a data frame; determining a number of zero bytes provided in a set of data bytes of the data frame; determining if there are enough zero bytes in the set of data bytes for data compression; when there are enough zero bytes for data compression, generating an encoding byte indicating locations in the data frame of the zero bytes; providing a data length code dependent on a number of non-zero data bytes in the data frame and the encoding byte, the data length code provided in a device header, the device header including a data message identifier; and forming and transmitting a compressed data frame including the encoding byte and the non-zero data bytes, wherein the number of bytes of the compressed data frame is less than a number of bytes of an uncompressed data frame.

In another embodiment, the electronic control unit comprises at least one of a communication control unit, an electronic stability control unit, a power train controller, a body electronic module, a head unit and a navigation system.

Another embodiment includes decompressing a compressed data frame at a receiver of another electronic control unit by: determining whether the data length code has a data length code value that corresponds to a stored data length code for the data message identifier, and when the data length code does not correspond to the stored data length code, decompressing the compressed data frame.

In another embodiment, decompressing the data frame comprises: reading the encoding byte and determining positions of zero bytes for the data frame; and reading the data bytes and providing the non-zero data bytes about the positions of zero bytes to form the data frame.

In another embodiment, the method is free from loss of data from the run time zero byte compression and the decompression and data compression does not occur for every one of the data frames provided to the communication bus. Further, the communication bus comprises a CAN bus provided on a land vehicle.

In another embodiment, the data length code and the data message identifier are provided in a message header and the data message identifier identifies a source of the data provided in the data frame. Further, the data provided comprises one of wheel speed data, yaw rate data, and navigation data.

In another embodiment, the invention provides an electronic control unit connected to a vehicle communication bus for transmitting a data frame through the vehicle communication bus to other electronic control units connected thereto. The electronic control unit includes a processor and a memory storing instructions. When executed by the processor, the instructions cause the electronic control unit to obtain a data frame; determine a number of zero bytes provided in a set of data bytes of the data frame; determine if there are enough zero bytes in the set of data bytes for data compression; when there are enough zero bytes for data compression, generate an encoding byte indicating locations in the data frame of the zero bytes; provide a data length code dependent on a number of non-zero data bytes in the data frame and the encoding byte, the data length code provided in a device header, the device header including a data message identifier; and forming and transmitting a compressed data frame including the encoding byte and the non-zero data bytes.

In another embodiment, the electronic control unit executes instructions to receive a data frame from the vehicle communication bus; determine whether the data length code has a value that corresponds to a stored data length code for the data message identifier, and when the data length code is less than the stored data length code, the processor decompresses the compressed data frame by reading the encoding byte and determining positions of zero bytes in the data frame; and reading the non-zero data bytes and providing the non-zero data bytes about the positions of zero bytes in the data frame to reconstruct the data frame.

In one embodiment, the non-zero data bytes are free from data compression.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
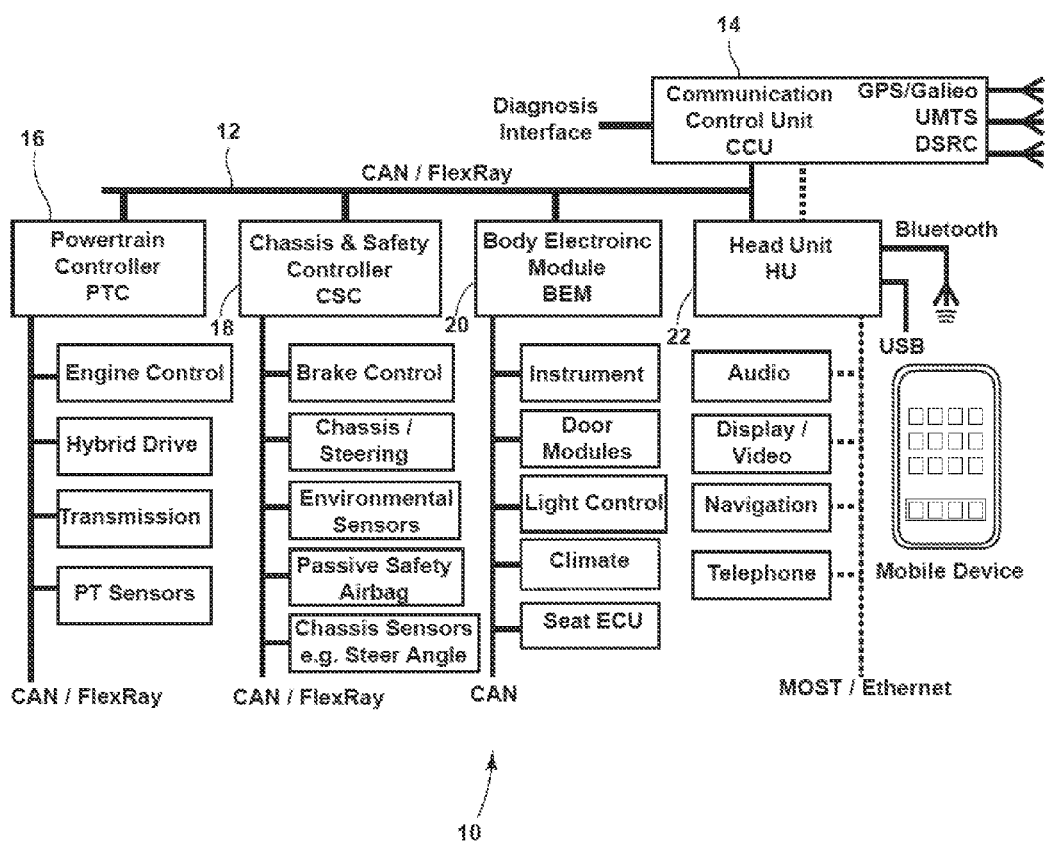
FIG. 1 shows a block diagram of electronic control units connected to a vehicle bus.

FIG. 1 shows a vehicle bus communication system 10 including a plurality of electronic control units connected to a communication bus 12. The communication bus 12 is a CAN bus or a FlexRay bus. Other buses, such as a media oriented systems transport (MOST) bus or Ethernet bus are also contemplated for use in the vehicle environment.

More specifically, FIG. 1 shows a communication control unit 14 that is connected to the communication bus 12. Further, a powertrain controller 16, a chassis and safety controller 18, a body electronic module 20 and a head unit 22 are connected to the communication bus 12. A mobile device is capable of communication with the head unit 22. Other electronic control units, including an electronic stability control unit and a navigation system are contemplated for use with the communication bus or the additional buses provided for the electronic control units 16, 18, 20, 22. Each of the control units has a controller or processor that processes data frames received from the communication bus 12 and provides data frames to the communication bus.

Figure 2:
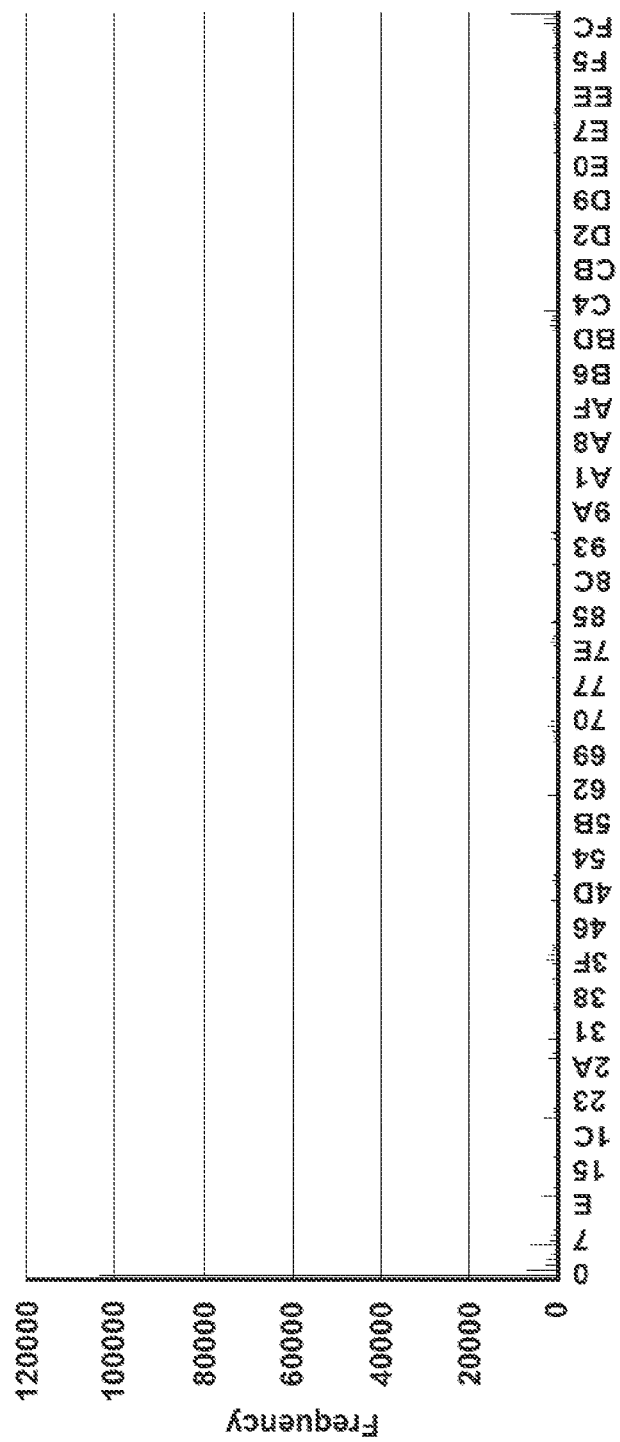
FIG. 2 shows a data histogram of values for bytes transmitted over a bus with zerobyte having the highest frequency of occurrence.

FIG. 2 is a data histogram of data defined as bytes, each byte having eight bits. Each eight bit byte is defined as a pair of characters, and more specifically 0 through F. Each of the pair of characters is a four bit value. For example, a four bit sequence of 0 0 0 0 represents the value "0" in FIG. 1, which can be considered "00" as both of the four bit sequences are all zero. The four bit sequence of 1 1 1 1 represents the letter F, which corresponds to the numeral 15. Finally, the sequence 1 0 0 1 represents the number value 9.

Individual eight bit bytes shown in FIG. 2 have a large number of values from 00 to FF. The number of bytes having a value of 0 is quite large, however, and this realization led to the concept of data compression when two or more zero bytes are provided in a data frame represented by a sequence of eight bytes.

Figure 3:
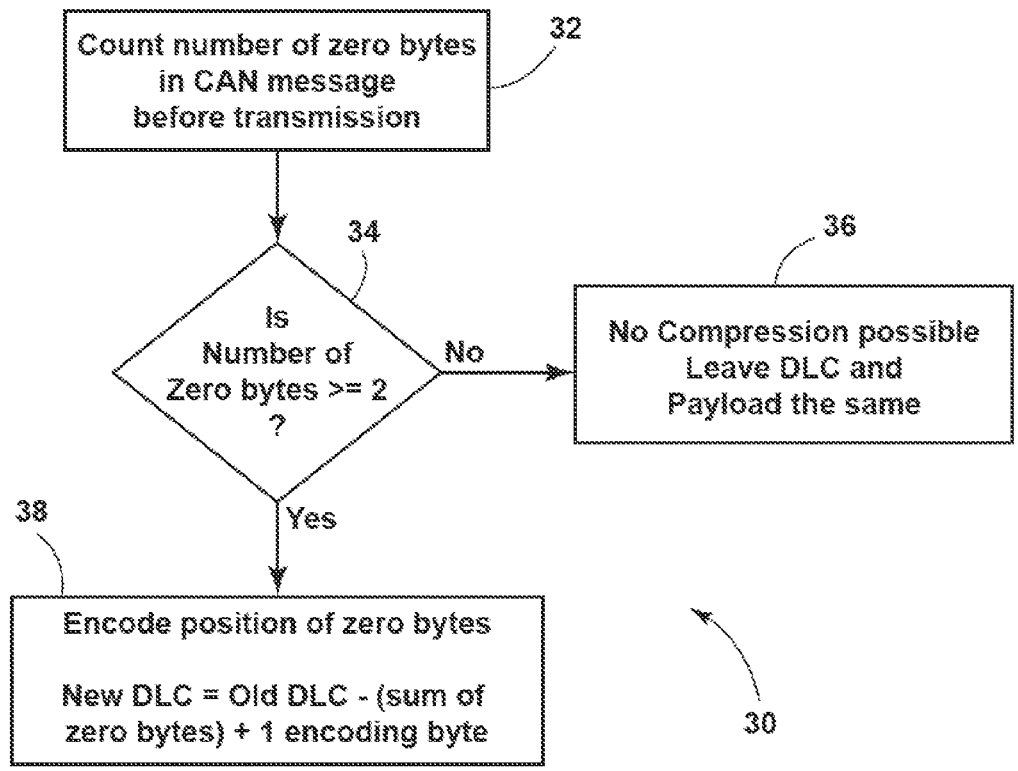
FIG. 3 shows a flowchart of a data compression routine.

FIG. 3 is a flowchart of a compression routine 30 for compressing data bytes having zero values in a data frame. At step 32 of the routine 30, the number of zero value bytes in a data frame or message that is waiting for transmission is counted.

At decision step 34, the number of zero value bytes is compared with the value two. If less than two zero values are provided with respect to the total values in the data frame, the routine 30 advances to step 36. At step 36, the data length code (DLC) is not changed and the frame is not changed. Thus, the data frame is transmitted without data compression as the number of zeroes was not enough to shorten the length of the DLC to thus compress the data frame.

At decision step 34, when the number of zero value bytes is at least two, the routine 30 advances to step 38. At step 38, an encoding byte is formed from the total bytes of the data frame. An example of encoding for a data frame having eight bytes is as follows.

Uncompressed bytes: 00 11 2A 00 F3 00 40 00
Single encoded byte: 1 0 0 1 0 1 0 1=A9

The A9 value is obtained from reading the values in reverse from right to left. Thus bits 1 0 1 0 become A (representing ten) and bits 1 0 0 1 become 9. Therefore, the hexadecimal value is A9. As only four of the uncompressed bytes are not zero and there is an encoding byte, the DLC=5 for the above frame after zero compression.

Compressed bytes for transmission: A9 11 2A F3 40

The first byte value of A9 is the encoding byte and identifies where the zero values in the data frame are placed. The following four data bytes thereafter are regular uncompressed nonzero value data bytes in sequence, minus the zero value bytes. The DLC=5 value is placed in a device header for the data frame having only five bytes. Besides the data length code, the device header includes a data message identifier.

The data frame, including the device header, is transmitted over the communication bus 12 or the unnumbered communication buses shown in FIG. 1. As set forth above, only data frames having two or more zero values are compressed. As data compression is selective and does not occur for every data frame, the term run time compression defines the arrangement wherein compression decisions occur essentially in real time.

Figure 4:
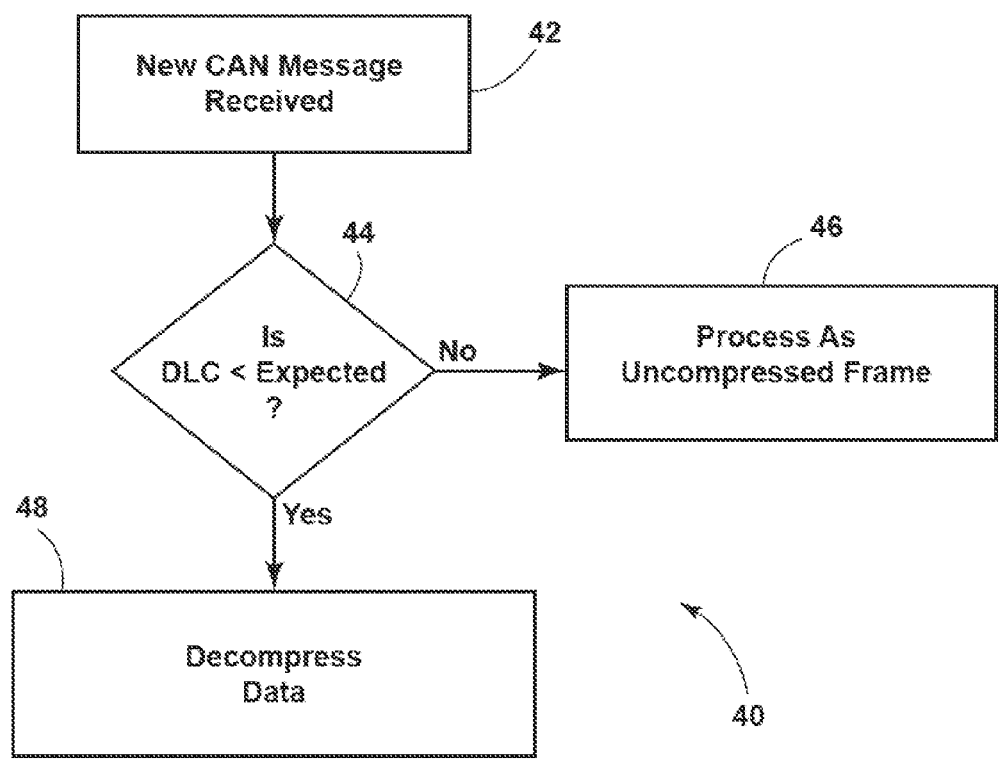
FIG. 4 shows a flowchart of a data decompression routine.

Decompression of a zero compressed data frame is as follows. As shown in the flowchart of FIG. 4, a processor executes a decompression routine 40 at one of the electronic control units shown in FIG. 1. At step 42, the routine 40 determines that a new message having a data frame is received. At decision step 44, the routine 40 determines whether the DLC value for the data frame is less than expected. If an expected value is determined, the decompression routine 40 advances to step 46 and the data frame is evaluated as a normal uncompressed data frame. When the DLC is less than the expected DLC value, the decompression routine advances to step 48.

At step 48, the encoded zero byte places or maps the zero values in a data frame. As set forth above, the zero values stored in the encoded zero byte are placed back where they were during encoding. The uncompressed nonzero data bytes sequentially fill the gaps or openings before, between or after the zero bytes to obtain the expected length of data for the frame. In instances when the uncompressed message is less than eight bytes, zero bits are encoded for the corresponding missing byte(s) to determine the encoded byte. As the expected length is already stored in a receiving electronic control unit, decompression reconstructs the frame with the expected length that is less than eight bytes.

During data transmission, the amount of bandwidth saved is dependent on the number of zero bytes provided in frames of data. Another important factor is that the compressed data is 100% reconstructed as no values are lost or otherwise altered from compressing the data frame into a compressed data frame and from decompressing the compressed data frame.

In some constructions, the electronic control units 16, 18, 20, 22 include a processor that has an executable program stored in a memory module, such as a ROM. The electronic control units also include a RAM for storing information from other vehicle units that is received through the communication bus 12. Non-transitory computer readable memory modules of the electronics control units include volatile memory, non-volatile memory, or a combination thereof and, in various constructions, may also store operating system software, applications/instructions data, and combinations thereof.

Thus, the invention provides, among other things, a method for compressing data that can be transmitted over a vehicle bus by compression of zero bytes in data frames. By reducing the amount of data transmitted, data bandwidth is saved and the number of buses can be minimized. Various features and advantages of the invention are set forth in the following claims.

What is claimed is:

1. A method for run time zero byte compression of data for transmission over a communication bus for a vehicle, the method being executed on an electronic control unit connected to the communication bus, the method comprising the steps of:
   obtaining a data frame;
   determining a number of zero bytes provided in a set of data bytes of the data frame;
   determining if there are enough zero bytes in the set of data bytes for data compression;
   when there are enough zero bytes for data compression, generating an encoding byte indicating locations in the data frame of zero bytes;

providing a data length code dependent on a number of non-zero data bytes in the data frame and the encoding byte, the data length code provided in a device header, the device header including a data message identifier; and forming and transmitting a compressed data frame including the encoding byte and the non-zero data bytes, wherein the compressed data frame has less bytes of data than an uncompressed data frame.

2. The method of claim 1, wherein the electronic control unit comprises at least one of an electronic stability control unit, a power train controller, a head unit and a navigation system.

3. The method of claim 1, including decompressing the compressed data frame at a receiver of another electronic control unit by:
determining whether the data length code has a data length code value that corresponds to a stored data length code for the data message identifier, and
when the data length code is less than the stored data length code, decompressing the compressed data frame.

4. The method of claim 3, wherein decompressing the compressed data frame comprises:
reading the encoding byte and determining and mapping positions of zero bytes for the data frame; and
reading the non-zero data bytes and providing the non-zero data bytes about the positions of zero bytes to reconstruct the data frame.

5. The method of claim 3, wherein the method is free from loss of data from the run time zero byte compression and decompression.

6. The method of claim 1, wherein data compression does not occur for every one of the data frames provided to the communication bus.

7. The method of claim 1, wherein the communication bus comprises a CAN bus provided on a land vehicle.

8. The method of claim 1, wherein the data length code and the data message identifier are provided in a message header, the data message identifier identifying a source of the data provided in the data frame.

9. The method of claim 8, wherein the data provided comprises one of wheel speed data, yaw rate data, and navigation data.

10. An electronic control unit connected to a vehicle communication bus for transmitting a data frame through the vehicle communication bus to other electronic control units connected thereto, the electronic control unit including:
a processor and a memory, the memory storing instructions that when executed by the processor, cause the electronic control unit to
obtain a data frame;
determine a number of zero bytes provided in a set of data bytes of the data frame;
determine if there are enough zero bytes in the set of data bytes for data compression;
when there are enough zero bytes for data compression, generate an encoding byte indicating locations in the data frame of zero bytes;
provide a data length code dependent on a number of non-zero data bytes in the data frame and the encoding byte, the data length code provided in a device header, the device header including a data message identifier; and
form and transmit a compressed data frame including the encoding byte and the non-zero data bytes.

11. An electronic control unit connected to a vehicle communication bus for transmitting a data frame through the vehicle communication bus to other electronic control units connected thereto, the electronic control unit including:
a processor and a memory, the memory storing instructions that when executed by the processor, cause the electronic control unit to
obtain a data frame;
determine a number of zero bytes provided in a set of data bytes of the data frame;
determine if there are enough zero bytes in the set of data bytes for data compression;
when there are enough zero bytes for data compression, generate an encoding byte indicating locations in the data frame of zero bytes;
provide a data length code dependent on a number of non-zero data bytes in the data frame and the encoding byte, the data length code provided in a device header, the device header including a data message identifier;
form and transmit a compressed data frame including the encoding byte and the non-zero data bytes;
receive the data frame from the vehicle communication bus;
determine whether the data length code has a value that corresponds to a stored data length code for the data message identifier, and
when the data length code is less than the stored data length code, decompress the compressed data frame.

12. The electronic control unit of claim 10, wherein the electronic control unit comprises one of an electronic stability control unit, a power train controller, a head unit and a navigation system.

13. The electronic control unit of claim 10, wherein the processor is performing run time zero byte compression, and the process is free from loss of data from the run time zero byte compression.

14. The electronic control unit of claim 10, wherein data compression does not occur for every one of the data frames provided to the vehicle communication bus.

15. The electronic control unit of claim 10, wherein the communication bus comprises a CAN bus provided on a land vehicle.

16. The electronic control unit of claim 10, wherein the non-zero data bytes are free from data compression.

17. The electronic control unit of claim 11, wherein the processor decompressing the compressed data frame when the data length code is less than the stored data length code, includes
reading the encoding byte and determining positions of zero bytes in the data frame; and
reading the non-zero data bytes and providing the non-zero data bytes about the positions of zero bytes in the data frame to reconstruct the data frame.

18. The electronic control unit of claim 11, wherein the electronic control unit comprises at least one of an electronic stability control unit, a power train controller, a head unit and a navigation system.

* * * * *